United States Patent
Samachisa et al.

(10) Patent No.: US 8,395,942 B2
(45) Date of Patent: Mar. 12, 2013

(54) JUNCTIONLESS TFT NAND FLASH MEMORY

(75) Inventors: George Samachisa, San Jose, CA (US); Johann Alsmeier, San Jose, CA (US); Andrei Mihnea, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 258 days.

(21) Appl. No.: 12/848,458

(22) Filed: Aug. 2, 2010

(65) Prior Publication Data

US 2011/0280076 A1    Nov. 17, 2011

Related U.S. Application Data

(60) Provisional application No. 61/345,352, filed on May 17, 2010.

(51) Int. Cl.
  *G11C 11/34* (2006.01)
  *H01L 29/06* (2006.01)
  *H01L 29/76* (2006.01)

(52) U.S. Cl. .......... 365/185.17; 365/185.33; 257/9; 257/67; 257/314

(58) Field of Classification Search .......... 365/185.17, 365/185.33; 257/9, 67, 314
See application file for complete search history.

(56) References Cited

U.S. PATENT DOCUMENTS

| | | | |
|---|---|---|---|
| 5,677,556 A | 10/1997 | Endoh | |
| 5,915,167 A | 6/1999 | Leedy | |
| 7,679,960 B2* | 3/2010 | Hyun et al. | 257/314 |
| 7,701,780 B2* | 4/2010 | Mihnea et al. | 365/185.33 |
| 7,812,404 B2 | 10/2010 | Herner et al. | |
| 8,017,991 B2* | 9/2011 | Kim et al. | 257/314 |
| 8,114,757 B1* | 2/2012 | Or-Bach et al. | 257/67 |
| 8,178,862 B2* | 5/2012 | Colinge | 257/9 |
| 8,203,148 B2* | 6/2012 | Sekar et al. | 257/67 |
| 2006/0250836 A1 | 11/2006 | Herner et al. | |
| 2006/0278913 A1 | 12/2006 | Mihnea | |
| 2009/0321830 A1 | 12/2009 | Maly | |

FOREIGN PATENT DOCUMENTS

EP    2161755 A1    3/2010

OTHER PUBLICATIONS

International Search Report issued in PCT Application PCT/US2011/034517, mailed on Sep. 20, 2011.
Weis, Marcus, et al. "Stacked 3-Dimensional 6T SRAM Cell with Independent Double Gate Transistors"; IC Design and Technology; IEEE International Conference—May 18, 2009.
Huang, Po-Chun, et al. "Eletric-Field Enhancement of a Gate-All-Around Nanowire Thin-Film Transistor Memory"; IEEE Electron Device Letters, vol. 31, No. 3, Mar. 2010.

(Continued)

*Primary Examiner* — Trong Phan
(74) *Attorney, Agent, or Firm* — The Marbury Law Group PLLC

(57) ABSTRACT

A method of making a NAND string includes forming a semiconductor layer over a major surface of a substrate, patterning the semiconductor layer into an elongated nanowire shaped channel extending substantially parallel to the major surface of the substrate, forming a tunneling dielectric layer over the channel, forming a plurality of charge storage regions over the tunneling dielectric layer and undercutting the channel using the plurality of charge storage regions as mask. The channel has a narrower width than each charge storage region width, and an overhanging portion of each of the plurality of charge storage regions overhangs the channel. The method also includes forming a blocking dielectric layer over the plurality of charge storage regions, such that the blocking dielectric layer fills a space below the overhanging portion of each of the plurality of charge storage regions and forming a plurality of control gates over the blocking dielectric layer.

2 Claims, 7 Drawing Sheets

OTHER PUBLICATIONS

Colinge, Jean-Pierre, et al. "Nanowire Transistors Without Junctions"; Nature Nanotechnology, vol. 5, No. 3, Mar. 1, 2010.

U.S. Appl. No. 11/125,939, filed May 9, 2005.

U.S. Appl. No. 11/395,995, filed Mar. 31, 2006.

Colinge, Jean-Pierre, "Nanowire Transistors Without Junctions", Nature Nanotechnology, pp. 1-5, Feb. 21, 2010.

* cited by examiner

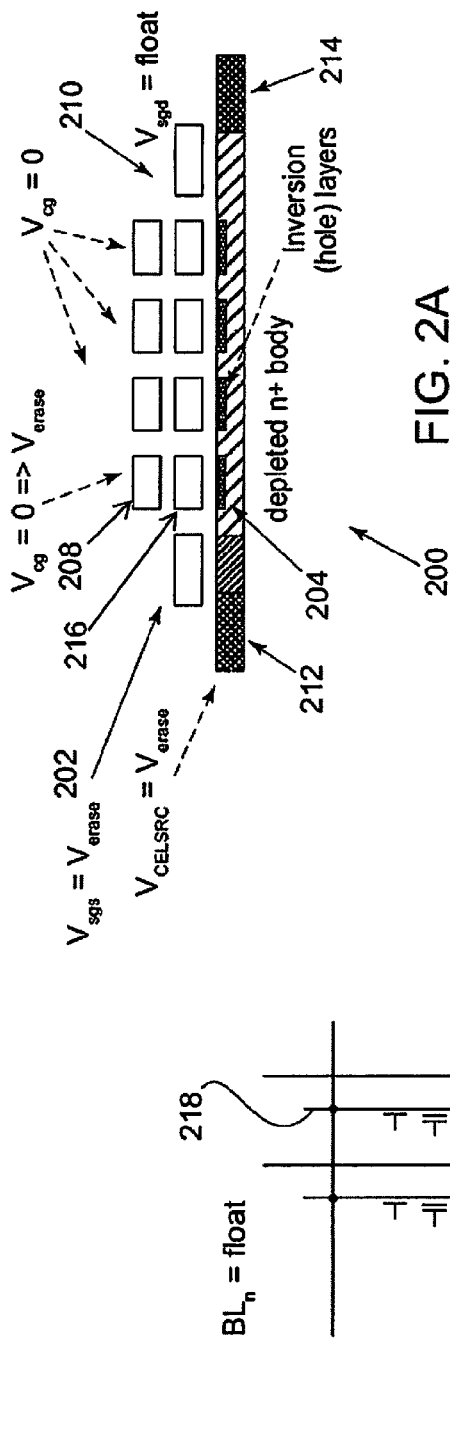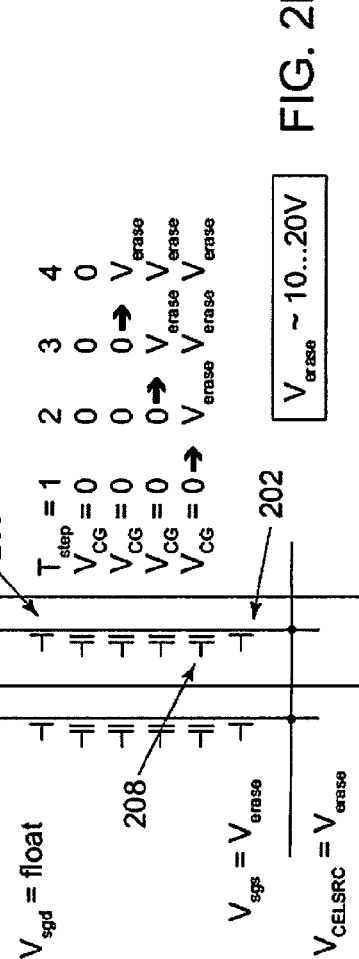
FIG. 2A
FIG. 2B

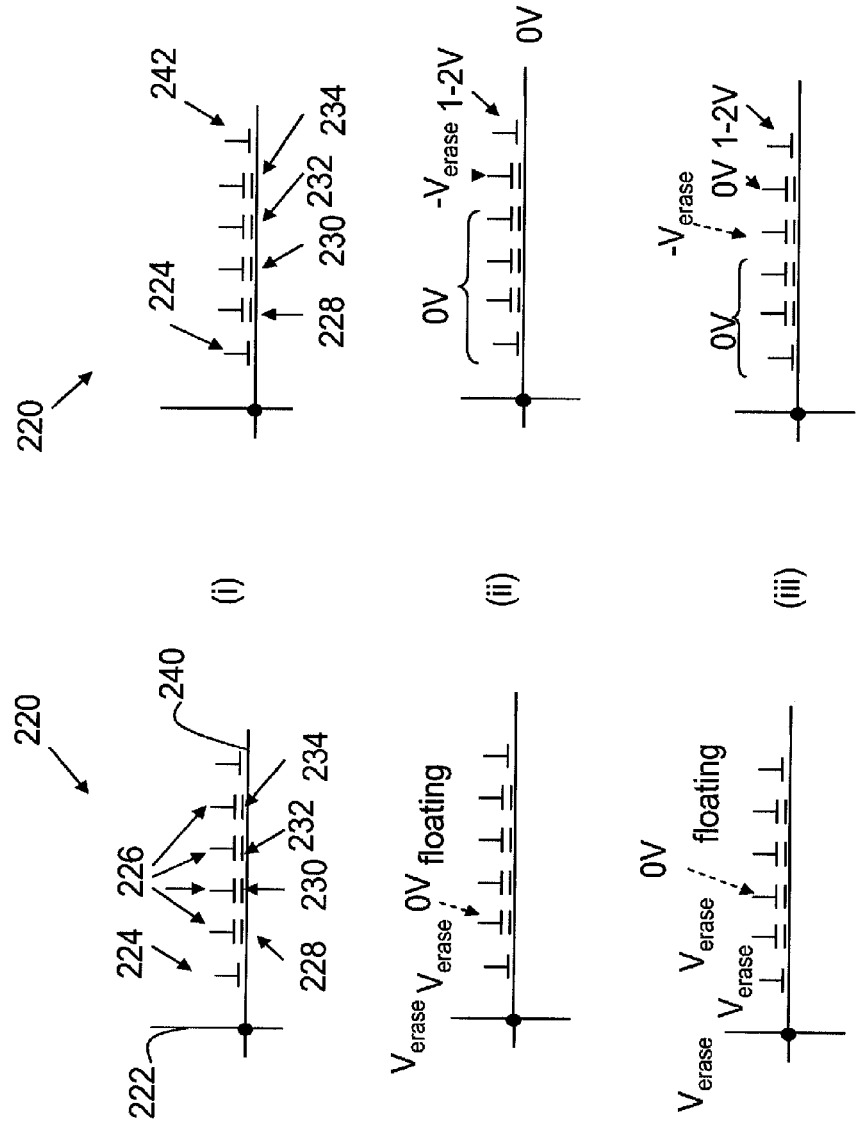

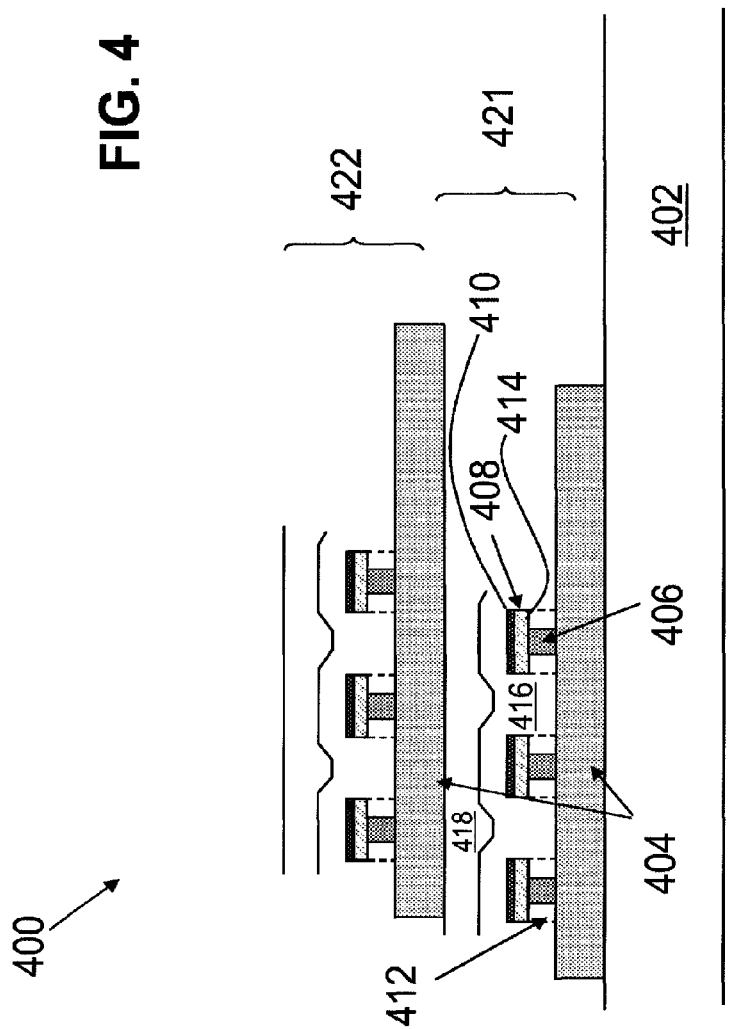

JUNCTIONLESS TFT NAND FLASH MEMORY

FIELD

The present invention is directed to semiconductor devices, particularly memory devices, and methods of fabricating and using same.

BACKGROUND

Many different types of memory devices are used with electronic devices such as computers, personal digital assistants (PDAs), digital cameras, and cellular phones. The memory devices include, for example, random-access memory (RAM), read only memory (ROM), synchronous dynamic random access memory (SDRAM), dynamic random access memory (DRAM), and flash memory, as described, for example, in U.S. Pat. No. 5,677,556 and US published application 2006/0278913 A1, both of which are incorporated herein by reference in their entirety.

Flash memory is a type of non-volatile memory that can be rewritten electronically for multiple times. Typical flash memory devices are based on MOSFET technologies having architectures similar to those of NOR or NAND gates.

Thin-film transistors (TFTs) can be employed in NAND type or NOR type memory devices. Unlike conventional MOSFETs that use a bulk semiconductor material as the substrate, a TFT has a thin film semiconductor active layer over a dielectric layer, which can be deposited over a variety of semiconductor, insulating or conductive substrates.

NAND flash memory devices typically include multiple strings of memory cells. A conventional string of memory cells is fabricated on a substrate, such as a p-type silicon substrate. Multiple n+ regions in a p-type substrate or in p-well in the substrate act as source and drain regions for the cells. Each memory cell has a floating gate formed over a tunnel dielectric layer and configured to store electrical charge. Control gates, formed over a blocking dielectric layer over the floating gates, are used to control reading, writing (programming), or erasing processes of the memory cells.

The drain side of the NAND string can be connected to the bit line through a selection transistor. The source side of the NAND string can be connected to a source line through another selection transistor. The control gates of an array of memory cells in the row direction can serve as a word line.

The write operation can be sequentially performed to a memory cell at the source line. A high voltage (about 20 V) is applied to the control gate of the selected memory cell. An intermediate voltage (about 10 V) can be applied to the control gates and unselected wordlines of the memory cells on the bit line side. If a voltage of 0 V is applied to the bit line, the potential is transmitted to the drain of the selected memory cell to cause charge injection from the substrate to the floating gate through the dielectric tunnel layer. After the charge injection, the threshold of the selected memory cell is shifted in the positive direction, and the state of the cell can be identified through its increased threshold voltage. The intermediate voltage does not cause the charge injection, and thus the not-selected cells have an unchanged threshold value.

Erase operation can be performed for a plurality of cells at the same time. For example, all the control gates can be set to 0 V, and a high voltage of 20 V can be applied on the p-well. Select gates and bit lines are left floating. Negative charges in the floating gates can thus be released to the substrate, and the threshold value is shifted to the negative direction.

During a read operation, a voltage of 0.1-1.2 V can be applied to the bit line and the control and selection gates of the cells in unselected NAND memory blocks, and a voltage of 0 V is applied to the source line and to the control gate of the selected memory cell, while unselected wordlines in selected NAND memory blocks have a voltage of about 3-8 V. If a current flow is detected at the selected cell, then the selected cell is read as the "1" state.

SUMMARY

In one embodiment, a non-volatile memory device includes at least one junctionless transistor and a storage region. The junctionless transistor includes a junctionless, heavily doped semiconductor channel having at least two dimensions less than 100 nm.

BRIEF DESCRIPTION OF THE DRAWINGS

FIGS. 2A-2B and 2C-2D are schematic diagrams illustrating sequential erase operations in a memory device according to embodiments of the invention.

FIG. 4 is a side cross-sectional view of a memory device according to another embodiment of the invention.

DETAILED DESCRIPTION

The following documents, the disclosures of which are incorporated herein by reference in their entirety, can be useful for understanding and practicing the embodiments described herein: U.S. Patent Application Publication No. 2006/0278913 A1; U.S. Pat. No. 5,677,556; and Colinge et al., "Nanowire transistors without junctions," Nature Nanotechnology, Feb. 21, 2010.

Figure 1:
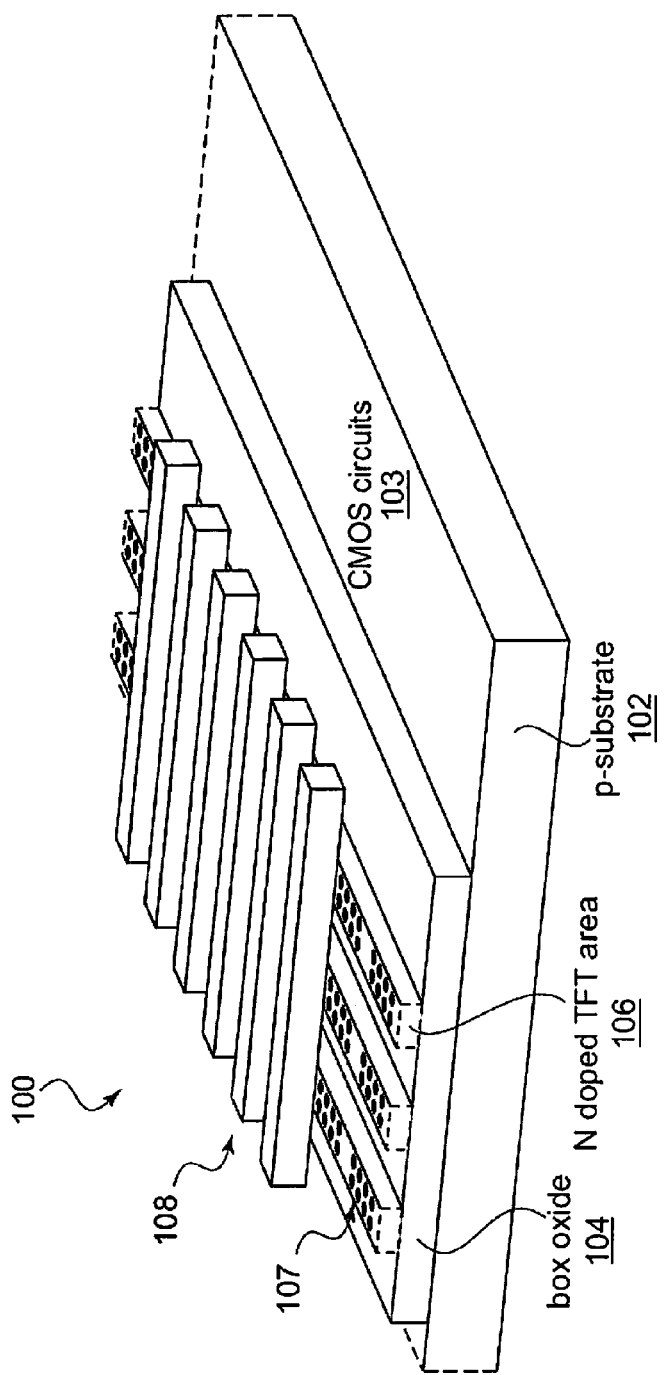
FIG. 1 is a perspective view of a 2D NAND memory device according to one embodiment of the invention.

FIG. 1 is a perspective view of one embodiment of NAND flash type memory device 100 employing a junctionless transistor. The device 100 can be fabricated on a semiconductor substrate 102, or any other substrate. The substrate 102 can be any semiconductor substrate known in the art, such as monocrystalline silicon, IV-IV compounds such as silicon-germanium or silicon carbide, III-V compounds, II-VI compounds, epitaxial layers over such substrates, or any other semiconducting or non-semiconducting material, such as glass, plastic, metal or ceramic substrate. The substrate may include integrated circuits fabricated thereon, such as CMOS driver circuits (CMOS circuits) and/or electrodes for the memory device.

For example, a semiconductor-on-insulator (SOI) structure for a TFT type memory device is shown in FIG. 1. The semiconductor substrate 102 can be a p-type silicon substrate or n-type silicon substrate. CMOS driver circuits for controlling the memory device 100 can also be built over or in the substrate 102. An insulating layer 104, such as a BOX oxide layer or another suitable insulating layer is formed over the substrate 102. A plurality of junctionless semiconductor channel regions 106 (e.g., N doped TFT area) are formed over the insulating layer. As used herein, the term "junctionless" means that the channel lacks a doped p-n junction in the boundary of the transistor. However, the channel may contain higher and lower doped regions of the same conductivity type.

The channel regions may be made of any suitable semiconductor material, such as silicon, germanium, silicon-germanium, silicon carbide, III-V semiconductor materials, such as GaAs, GaN, etc., II-VI semiconductor materials, such as ZnSe, etc. Other semiconductor materials, such as semiconducting carbon nanotubes, may also be used.

The semiconductor material may be single crystalline, polycrystalline or amorphous. For SOI type process, the semiconductor material 106 is deposited as a amorphous silicon or polysilicon and then crystallized or recrystallized using thermal or laser annealing. Alternatively, the channels 106 may be formed in a single crystal semiconductor substrate or in a single crystal layer directly on a surface of a single crystal substrate.

The channels 106 may be formed by depositing a semiconductor layer, followed by photolithographic patterning (e.g., masking and etching) of the layer into the elongated or strip shaped channels 106. Preferably, each channel 106 comprises a semiconductor nanowire which is formed by photolithographic patterning described above or by growth on a separate substrate in nanowire form followed by transfer of the nanowire to the device substrate 102. Thus, the semiconductor channels are preferably narrow and can have two dimensions less than 100 nm. For example, the channel 106 can be a nanowire channel having a height of 2 to 20 nm, a width of 5 to 50 nm, a length larger than 50 nm, such as larger than 100 nm.

The channels 106 are preferably substantially uniformly doped (e.g., n or p-type doped) along their elongated direction. Preferably, each channel 106 is n or p-type doped to degeneracy. A degenerate semiconductor is a semiconductor with such a high doping level that the material starts to act more like a metal than as a semiconductor. At high enough impurity concentrations the individual impurity atoms may become close enough neighbors that their doping levels merge into an impurity band and the behavior of such a system ceases to show the typical traits of a semiconductor, e.g. its increase in conductivity with temperature. On the other hand, a degenerate semiconductor still has far fewer charge carriers than a true metal so that its behavior is in many ways intermediary between semiconductor and metal.

While the degeneracy doping level varies for different semiconductors, for example, the doping level can be at least $2\times10^{18}$ cm$^{-3}$, or at least $1\times10^{19}$ cm$^{-3}$, preferably in the range of 1-5$\times10^{19}$ cm$^{-3}$ for n-type silicon (i.e., silicon doped with P, As and/or Sb).

As shown in FIG. 1, a plurality of charge storage regions 107 are located over each channel. Each charge storage region 107 comprises one of a dielectric isolated floating gate, an oxide-nitride-oxide charge trapping film (ONO CTF), or conductive nanodots, such as metal nanodots in an insulating matrix. For the floating gate type charge storage region, any suitable materials, such as polysilicon, can be used so long as the work function of the floating gate allows electron injection, and the work function affects the threshold of the device.

A plurality of control gate electrodes 108 are formed over the charge storage regions 107 and over the channels 106. The control gate electrodes may be made of any suitable conductive material, such as polysilicon or metal. For example, the metal electrodes can comprise tungsten, copper, aluminum, tantalum, titanium, cobalt, titanium nitride or alloys thereof. In some embodiments, tungsten is preferred to allow processing under a relatively high temperature. In some other embodiments, copper or aluminum is a preferred material. Barrier and adhesion layers, such as TiN layers, may be included. The control gate material is selected to have a work function that disfavors electron injection from the control gate.

As shown in FIG. 1, the NAND flash memory device 100 includes at least one NAND string. For example, three adjacent NAND stings are shown. Each NAND string includes the junctionless, heavily doped semiconductor channel 106, a plurality of control gate electrodes 108 adjacent to the channel, and one of a plurality of charge storage regions 107 located between the channel and each of the plurality of control gate electrodes. For example, as shown in FIG. 1, each NAND string includes six control gates 108.

Each NAND string can be viewed as a plurality of junctionless thin film transistors containing a common junctionless nanowire channel 106, and a charge storage region 107 between the channel 106 and each control gate 108. Compared with conventional transistors, the nanowire channel lacks a doped p-n junction (i.e., source or drain diffusion). Such junctionless transistors are also known as gated resistors.

The channel 106 has a nanoscale cross-sectional dimension such that a voltage on the order of about −3 V to 3 V applied to a control gate electrode can deplete the free carriers or cause inversion in the channel. If the bias or electric field is absent in the channel, the channel can be conductive or "on." Thus, the channel is gated (i.e., controlled by the gates) and can be switched between on and off states without the need for a diffusion junction.

The memory device 100 of FIG. 1 is a "horizontal" type, two dimensional NAND flash memory device. Each NAND string is located substantially parallel to a major surface 103 of the substrate 102. In other words, each channel is elongated in a direction parallel to this major surface 103.

The junctionless TFT structure comprises depletion type (n+ body) cell transistors. Without the junctions and the resulting doping diffusion, short channel effects can be reduced, and the structure can be scaled to below 20 nm. As will be described below, three dimensional memory devices can also use the junctionless transistor in accordance with embodiments of the invention.

The three dimensional structures with junctionless transistors are advantageously not affected by the thermal budget of a typical three dimensional device. In other words, in a typical three dimensional device, each device level includes dopant ion implantation followed by the activation anneal. The activation anneal in each higher device level negatively affects the dopant distribution in the lower levels. With the junctionless devices, the activation anneals may be avoided.

Furthermore, when lightly-doped diffusions are included, in the memory cells, series resistance can increase due to the charge trapping between control gates during the program/erase cycles. Thus, heavily-doped junction-free NAND flash string also advantageously has less degradation in the series resistance.

Other advantages of junctionless NAND flash memory devices include, for example, low aspect ratio active area and control gate process, programming and reading being the same as conventional NAND flash memory, improved coupling ratio (e.g., a ratio of at least about 0.5), and n-body TFT NAND flash memory built in silicon on insulator (SOI). The n-body is also advantageous for 3D vertical NAND integration, as will be described below. However, it is noted that because the erase potential drops along the n-type body, a modified erase operation may be needed.

FIG. 2A and 2B are schematic diagrams illustrating a sequential erase operation in a memory device 200. FIG. 2A shows a cross-sectional view of a string of memory cells of a horizontal NAND device, such as that of FIG. 1. FIG. 2B shows a circuit schematic of a plurality (e.g., two) memory strings coupled together.

The memory device 200 comprises a first access gate electrode (also referred to as a selection gate electrode), such as a source side selection gate electrode 202 adjacent to one end (e.g., source side) of the channel 204. The memory device 200 can comprise a plurality of memory strings, as illustrated in FIG. 2B.

The first access gate electrode 202 can be located at the source end for selecting, for example, the plurality of control gate electrodes 208. The plurality of control gate electrodes 208 having a common channel 218 can be grouped into a plurality of strings.

A second access gate electrode (e.g., drain selection gate electrode) 210 can be located adjacent to another end (drain side) of the channel 204. One of a plurality of charge storage regions 216 is located between the channel 204 and each of the plurality of control gate electrodes 208. No charge storage region is located between the access gate electrodes 202, 210 and the channel 204. As discussed above, application of a voltage on the order of −3 V to 3V to the channel 204 may deplete the free carriers or cause inversion in the channel 204, such as a depleted n+ body or inversion (hole) layers.

The memory device 200 further comprises a first contact 212 contacting the first end (source side) of the channel 204 adjacent to the first access gate electrode 202, and a second contact 214 electrically contacting the second end (drain side) of the channel 204 adjacent to the second access gate electrode 210. The first and second contacts 212, 214 can be made from a metal or a heavily doped n++ semiconductor layer. The NAND string of the memory device 200 as shown comprises a string of memory cells coupled to each other through the junctionless semiconductor channel 204.

The string can be sequentially erased by applying an erase voltage $V_{erase}$ to a control gate 208 of one of the string of memory cells while applying zero volts to control gates ($V_{CG}=0$) of the remaining memory cells, while applying the erase voltage to the source electrode 212 ($V_{CELSRC}=V_{erase}$) and to an access gate electrode 202 ($V_{sgs}=V_{erase}$), and floating the drain access gate electrode 210 ($V_{sgd}=$Float), as shown in FIGS. 2A and 2B.

Starting from the source side, the control gates are stepwise boosted from 0 volts to $V_{erase}$ (erase voltage). The drain electrode (i.e., bit line) 214 is allowed to float ($BL_{n=Float}$). $V_{erase}$ may be 5-20 V, such as 10-15 V. For example, at $T_{step}=1$ the source line 212 and the gate 202 of the select transistor adjacent to the source line 212 are both biased to $V_{erase}$, ($V_{CELSRC}=V_{erase}$), ($V_{sgs=Verase}$) and the control gates of all the cells are biased at 0 V ($V_{CG}=0$). For the first cell 208, i.e., the one closest to the source line 212, since the channel voltage is $V_{erase}$ and $V_{CG}=0$, the first cell 208 erases. The other cells do not erase because the high channel voltage $V_{erase}$ cannot propagate past the first cell 208 with $V_{CG}=0$. At $T_{step}=2$, the first cell 208 has its control gate potential switched from 0 V to $V_{erase}$, while the control gates of the other cells remain at 0 V. The channel voltage V erase thus propagates past the first cell 208, and the second cell erases. As the control gate potentials are progressively switched from 0 V to $V_{erase}$ in the direction from the source to the drain at $T_{step}=3$ and 4, the third and fourth cells are sequentially erased. These steps are summarized in Table I below:

TABLE I

| $T_{step}$ | 1 | 2 | 3 | 4 |
|---|---|---|---|---|
| $V_{CG}$ | 0 | 0 | 0 | 0 |
| $V_{CG}$ | 0 | 0 | 0 | $V_{erase}$ |
| $V_{CG}$ | 0 | 0 | $V_{erase}$ | $V_{erase}$ |
| $V_{CG}$ | 0 | $V_{erase}$ | $V_{erase}$ | $V_{erase}$ |

FIGS. 2C and 2D are schematic circuit diagrams illustrating exemplary erase sequences with positive voltages and negative voltages, respectively, for a NAND string 220 based on an n-type channel 240. FIG. 2C is a schematic diagram illustrating a variant of the sequential erase operation described above with respect to FIGS. 2A and 2B, while FIG. 2D is a schematic diagram illustrating an alternative sequential erase operation described above with respect to FIGS. 2A and 2B. The string 220 includes a source line 222, a source side selection (i.e., access) gate 224, and control gate electrodes 226 for four cells 228, 230, 232, 234.

In FIG. 2C, in the first erase sequence (row "ii"), $V_{erase}$ is applied to the source line 222 and the source selection gate 224. The first cell 228 has a 0 volts applied to its control gate. The other cells 230 to 234 have control gates that can be allowed to float. In this case, the first cell 228 is erased, with the electrons stored in its storage region tunneling through the tunneling dielectric layer and into the channel 240. The channel between the first cell 228 and the source line 222 is "open" because the selection gate 224 has the $V_{erase}$ applied thereon as does the source line 222. Thus, the electrons injected from the storage region of the first cell 228 can flow through the channel 240 to the source line 222.

In the next sequence (row "iii"), source line 222, the source selection gate 224, and the control gate of the first cell 228 have $V_{erase}$ applied thereon. The second cell 230 has 0 V applied to its control gate while the remaining cells 232, 234 control gates are allowed to float. In this case, the second cell 230 is erased. The $V_{erase}$ can thus be sequentially applied to the cells 228, 230, . . . until the last cell in the string 220 is erased.

For a NAND string based on a p-type channel, the same sequence can apply but the polarity of the voltages will change to negative. Specifically, a p-type channel emits electrons in erase, and thus should be inverted under $V_{erase}$. Thus, the doping concentration should not be much above the onset of degeneracy, i.e., the concentration should not be greater than about $10^{19}$ cm$^{-3}$.

In summary, the method of FIG. 2C includes applying an erase voltage to a source line 222 of the NAND string 220, applying at substantially the same time the erase voltage to a source side access gate 224 of the NAND string, and erasing a first memory cell 228 located adjacent to the source side access gate 224 by applying zero volts to a control gate 226 of the first memory cell 228 while allowing control gates 226 of remaining memory cells 230-234 of the NAND string 220 to float. The method also includes erasing a second memory cell 230 located adjacent to the first memory cell 228 by applying the erase voltage to a control gate 226 of the first memory cell 228 and applying zero volts to a control gate 226 of the second memory cell 230 while allowing control gates of remaining memory cells 232, 234 of the NAND string to float. The method further includes erasing a third memory cell 232 of the NAND string located adjacent to the second memory cell by applying the erase voltage to the control gates 226 of the first 228 and the second 230 memory cells, applying zero volts to the control gate 226 of the third memory cell 232 and letting the control gate of the last cell 234 float. The process is then repeated to erase the last cell 234.

The erase voltage can be continuously applied or reapplied to the source line 222 of the NAND string and to the source side access gate 224 of the NAND string during the steps of erasing the first, the second, the third and the fourth memory cells 228-234. The erase voltage comprises a positive voltage (e.g., 10 to 20V) for an n-type doped channel or a negative voltage (e.g., −10 to −20V) for a p-type doped channel.

In this erase method, unselected blocks have their source select gate held at a low voltage, e.g., less than 4 V while common array source electrode rises to the high positive voltage $V_{erase}$. Therefore the select gate oxide must be sufficiently thick to withstand the ensuing high voltage stress over successive erase operations and cycles without degradation.

In FIG. 2D, an alternative sequential erase method is shown. In the first sequence (row "ii"), a negative voltage −$V_{erase}$ is applied to the control gate of cell 234 adjacent to the drain select gate 242. The drain select gate 242 has a voltage of 1-2 V applied thereto. The channel and the source select gate 224 has 0 V applied thereto. The other cells 230, 228, 232 have 0 V applied to their control gates. In this case, the cell 234 is erased. In the next sequence (row "iii"), −$V_{erase}$ is applied to the control gate of cell 232, while the other cells 228, 230, 234 and the source select gate 224 have 0 V applied thereon. In this case cell 232 is erased. The NAND string 220 can thus be sequentially erased from the drain side. For a p-type substrate, the polarity of the voltage will be reversed while the sequence remains the same.

In summary, the erase method includes applying zero volts to the channel, applying zero volts to a source side access gate 224, applying a voltage of, e.g., 1 to 2V, to a drain side access gate 242 of the NAND string, erasing a first memory cell 234 located adjacent to the drain side access gate 242 by applying an erase voltage to a control gate of the first memory cell 234 while applying zero volts to control gates of remaining memory cells 228-232 of the NAND string. The method also includes erasing a second memory cell 232 of the NAND string located adjacent to the first memory cell 234 by applying an erase voltage to a control gate of the second memory cell 232 while applying zero volts to control gates of remaining memory cells 228, 230, 234 of the NAND string. The method also includes erasing a third memory cell 230 located adjacent to the second memory cell 232 by applying an erase voltage to a control gate of the third memory cell while applying zero volts to control gates of remaining memory cells 228, 232, 234. The fourth memory cell 228 can be erased using the same method as described above.

As with the prior embodiment, the zero volts is applied or reapplied to the channel and to the source side access gate of the NAND string and a voltage of 1-2 V is applied or reapplied to the drain side access gate of the NAND string during the steps of erasing the first, the second and the third memory cells. The erase voltage comprises a negative voltage for an n-type doped channel or a positive voltage for a p-type doped channel.

After a row of memory cells is erased and before the erase proceeds to the next row, an erase-verify operation can be applied to the row that was just erased. The erase-verify operation can be, for example, reading the row of memory cells. Once successful erase in the row is verified, the next row is erased and then verified. If the row does not pass the erase-verify, the row alone can be erased again, for example, by being pulsed again to a higher voltage. This advantageously can save time as compared with the erase-verify process in conventional NAND memory devices, where erase-verify is performed after the erase operation has been applied to a whole block of memory cells. In the conventional NAND memory devices, if the erase-verify process of the whole block fails to pass, it would not be known which row needs an extra erasure, and thus all rows would have to be erased again using stepped-up voltages at a great expenditure of time.

Figure 3A:
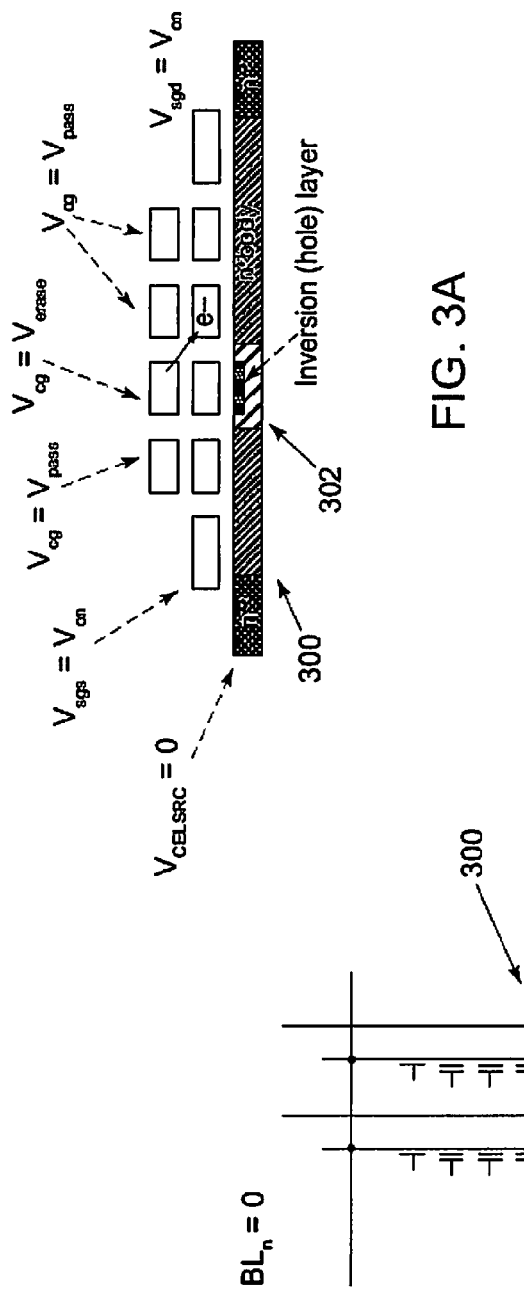
FIGS. 3A and 3B are schematic diagrams illustrating a word line erase operation in a memory device according to another embodiment of the invention.
Figure 3B:
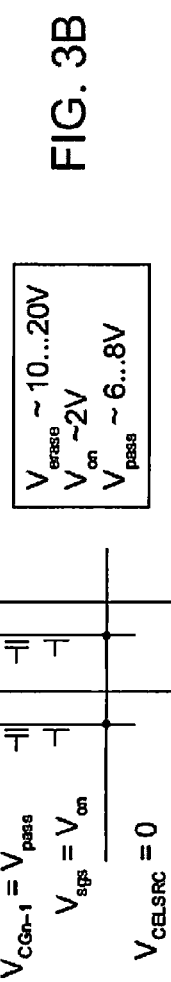

FIGS. 3A and 3B are schematic diagrams illustrating a word line erase operation (e.g., a random single word line erase operation) in a memory device 300. The single word line process can possibly be used for both erase and programming. For example, all cells in a single selected string or row, including the cell 302 can be erased by applying a−$V_{erase}$ (about negative 10-20 V) to its control gate ($V_{CG}$=$V_{erase}$), a $V_{pass}$ (about 6-8 V) which has a lower absolute value than $V_{erase}$ to control gates $V_{CG}$ of the remaining memory cells ($V_{CG}$=$V_{pass}$), 0 V to the source and drain sides of the channel (via source and bit lines, respectively)($V_{CELSRC}$=0) and a small voltage $V_{on}$ (about 1-2V, having a smaller absolute value than $V_{pass}$) to the source and drain selection (i.e., access) gates ($V_{sgs}$=$V_{on}$, $V_{sgd}$=$V_{on}$). A positive $V_{erase}$ can be used if the channel is p-type rather than n-type as shown. This method is especially suited for devices with nanodot charge storage regions. Further, as above, a voltage applied to the channel 204 may deplete the free carriers or cause inversion in the channel 204, such as an inversion (hole) layer in a n+body. These conditions are summarized in Table II below:

TABLE II

| | |
|---|---|
| $V_{sgd}$ | $V_{on}$ |
| $V_{CGn+2}$ | $V_{pass}$ |
| $V_{CGn+1}$ | $V_{pass}$ |
| $V_{CGn}$ | −$V_{erase}$ |
| $V_{CGn-1}$ | $V_{pass}$ |
| $V_{sgs}$ | $V_{on}$ |

FIG. 4 is a cross-sectional view of a monolithic, three dimensional NAND memory device 400 which contains horizontal NAND strings in each device level. To fabricate the device, an insulating layer such as an oxide layer 404 can be formed on a major surface of a substrate 402. A semiconductor layer can be formed over the oxide layer 406, and is then patterned into elongated highly n-doped TFT channel areas 406, which can have a nanowire shape and extend substantially parallel to the major surface of the substrate 402. A tunnel dielectric layer 408, such as a silicon oxide layer can be formed over the channel 406. A plurality of charge storage regions 410 can be formed over the tunneling dielectric layer 408. Regions 410 may comprise metal floating gates or conductive nanodots. Regions 410 and layer 408 may be patterned into discrete regions using photolithographic patterning.

Then, an undercut 412 is formed in the channel 406 using the plurality of charge storage regions 410 as a mask, thereby narrowing the width of the channel 406 relative to the storage region 410. The undercut may be formed by selective wet etching using a liquid etching medium which selectively etches the semiconductor material of the channel 406 over that of the dielectric layer 408 or the charge storage regions 410. The undercut has a width of 2-15 nm, such as 2-10 nm. An overhang portion 414 of each of the plurality of charge storage regions 408 therefore overhangs the channel 406.

A blocking dielectric layer 416, such as a silicon oxide layer, is then formed over the plurality of charge storage regions 410, such that the blocking dielectric layer 416 fills a space (i.e., the undercut) 412 below the overhanging portion 414 of each of the plurality of charge storage regions 410 and the tunneling dielectric layer 408. A plurality of control gates 418 can then be formed over the blocking dielectric layer 416 by depositing a conductive layer and pattering it into gate strips, as shown in FIG. 1. This completes the first device level 421.

The above steps can be repeated to form a monolithic, three dimensional array of two or more device levels, 421, 422. Each device level includes one or more horizontal NAND strings parallel to the major surface of the substrate 402.

A narrowed width of the n-doped TFT channel helps the channel to become depleted completely, thereby improving the coupling ratio. The coupling ratio of the device can be, for example, at least 0.5. Prior art nanodot flash memory devices or thin metal sheet floating gate memory devices suffer from low program/erase window due to a low coupling ratio. After the undercut is formed, a shallow trench isolation (STI) fill, such as a silicon oxide fill, can be formed over the floating gates and filling the undercut areas. The control gate layer 418 can then be formed over the STI layer 416.

Figure 5:
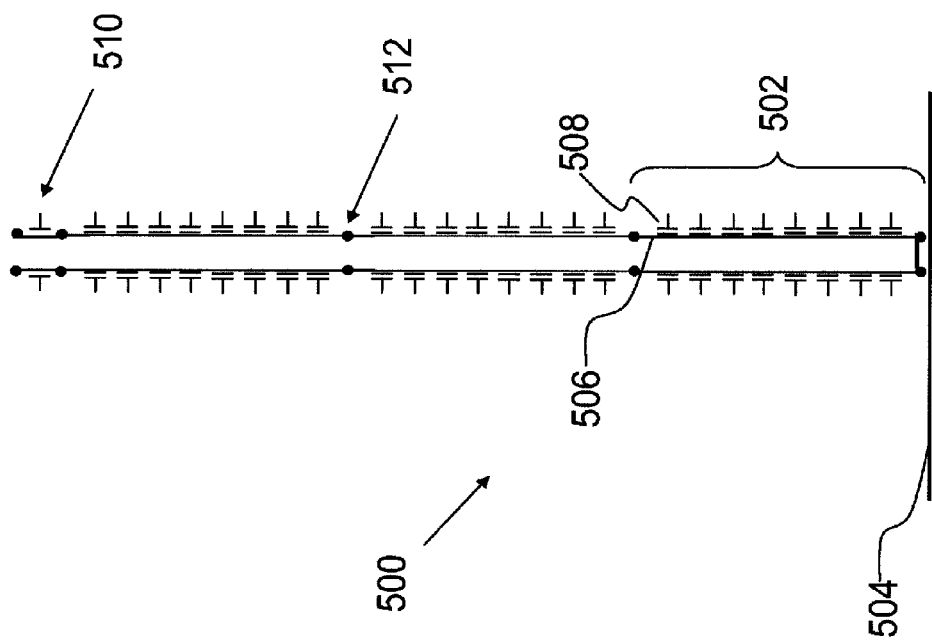
FIG. 5 is a schematic diagram of a 3D vertically stacked junctionless NAND memory device according to another embodiment of the invention.

FIG. 5 is a schematic circuit diagram of a vertical, stacked, three dimensional junctionless NAND memory device 500 comprising a plurality of NAND strings 502 located substantially perpendicular to a major surface 504 of a substrate. The channel 506 of the strings 502 in this case extends substantially perpendicular to the major surface 504 of the substrate. The plurality of control gate electrodes 508 are also stacked in a direction substantially perpendicular to the major surface 504 of the substrate.

The plurality of strings 502 as shown in FIG. 5 are stacked in the direction substantially perpendicular to the major surface 504 of the substrate. Each of the plurality of NAND strings 502 comprises the channel 506 which extends substantially perpendicular to the major surface 504 of the substrate, the plurality of control gate electrodes 508 which are stacked in the direction substantially perpendicular to the major surface 504 of a substrate, and access gate electrodes 510 adjacent to each respective end of the channel 506. A gateless semiconductor (e.g., n-type polysilicon) transfer region 512 can be located between adjacent ends of channels of adjacent NAND strings 502. The two stings 502 adjacent to the major surface 504 of the substrate can be connected thereby forming a longer string.

One-time processing of multi n-layer stacks of 3D NAND structures has been difficult. In particular, because the conventional memory devices employ the p-type body, the transfer region cannot be easily inverted. The charge trapping problem is aggravated in the transfer region. The junctionless memory devices in accordance with embodiments of the invention can employ heavily doped n-type body, thereby solving the problems when the p-type body is used.

In a junctionless NAND memory device, individual memory cells are connected to the bitline (metal line) through other memory cells of the NAND string. Thus, overall string conductance is limited by the conductivity of cell regions between adjacent gate stacks, and the channels cannot be easily turned on by voltage applied on unselected wordlines in read, $V_{read}$. In comparison, a transistor usually has its source and drain connected to a metal line, so the resistance of the connecting path from the transistor channel to the metal line can be minimized by proper device and circuit layout. MOSFETs in logic and analog circuits are designed not to emit electrons in surrounding dielectric layers during their normal operation. In contrast, NAND cells are required to emit electrons to and from charge storage nodes such as the floating gate, nanodot, or charge storage layers. These emitted electrons may accumulate over program/erase cycles in dielectric layers between gate stacks, causing string current degradation.

Other design considerations in accordance with embodiments of the invention include the doping level in the channels. If the doping were too low, the NAND string is likely difficult to erase and can be prone to erase degradation after program/erase cycling, due to the low conductivity associated with the low doping and the resulting difficulty in electrically coupling neighboring cells.

The heavily doped channel throughout the entire string, including the regions in between gate stacks, allows the NAND string to erase more easily, with less cycling-induced degradation.

Figure 6:
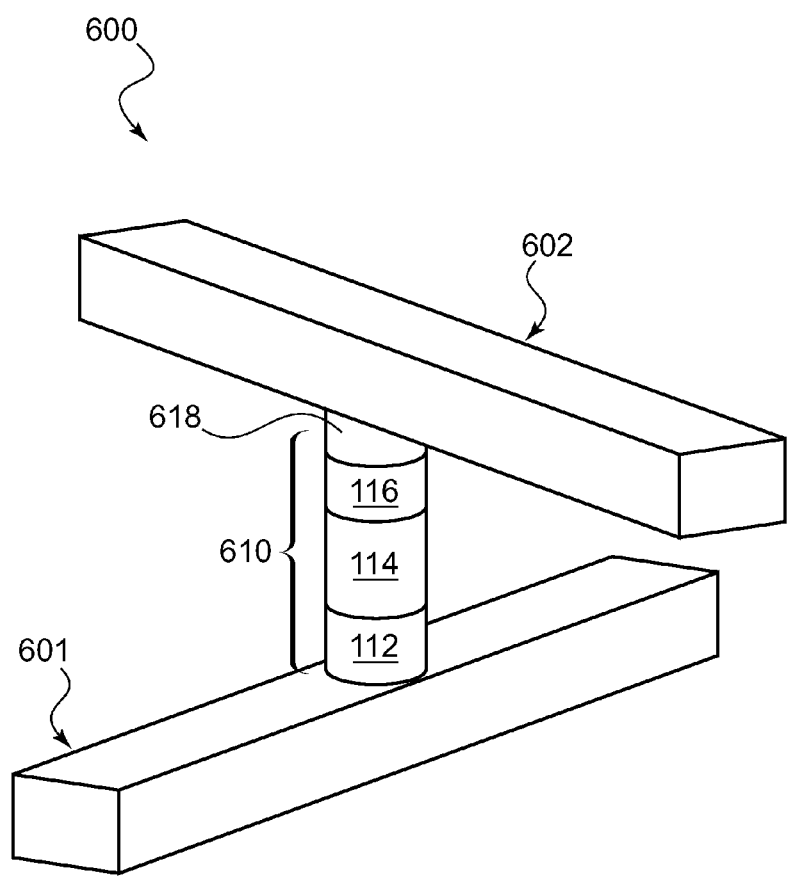
FIG. 6 is a perspective view of a resistivity switching type memory device according to another embodiment of the invention.

While a NAND flash type device was described above, in another embodiment of the invention, the memory device may comprise a so-called resistivity switching non-volatile memory device (also referred to sometimes as a ReRAM device). An exemplary device is shown in FIG. 6. A non-volatile memory cell 600 includes a junctionless transistor 610 steering element located in series with the storage element 618. The transistor 610 and the storage element 618 are disposed between two electrodes 601 and 602.

The resistivity switching material comprises at least one of a fuse, antifuse dielectric, switchable metal oxide (e.g., nickel or vanadium oxide), complex metal oxide layer, carbon nanotube material, graphene resistivity switchable material, carbon resistivity switchable material, phase change material, conductive bridge element, or switchable polymer material.

As a non-limiting example, FIG. 6 illustrates the perspective view of a memory cell formed according to an embodiment of the present invention. A bottom conductor 601 is formed of a conductive material, for example tungsten, and extends in a first direction. Barrier and adhesion layers, such as TiN layers, may be included in bottom conductor 601. The junctionless transistor 610 contains a junctionless channel in a shape of a nanowire extending perpendicular to the bottom conductor 601. The channel ends 112, 116 are visible in FIG. 6. The middle portion of the channel is covered by a circular wrap control gate 114.

The resistivity switching layer 618 is disposed over or below the transistor 610. Top conductor 602 may be formed in the same manner and of the same materials as bottom conductor 601, and extends in a second direction different from the first direction. The transistor 610 is vertically disposed between bottom conductor 601 and top conductor 602.

The transistor and the storage element may have a cylindrical shape as illustrated in FIG. 6, or a shape other than cylindrical. For a detailed description of a design of a resistivity switching memory cell comprising a diode and a metal oxide, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.), each of which is hereby incorporated by reference.

The above described memory cell shown in FIG. 6 may be located in a one memory level device. If desired, additional memory levels can be formed above the first memory level to form a monolithic three dimensional memory array. In some embodiments, conductors can be shared between memory levels; i.e. top conductor 602 shown in FIG. 6 would serve as the bottom conductor of the next memory level. In other embodiments, an interlevel dielectric is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a NAND string, comprising:
    forming a semiconductor layer over a major surface of a substrate;
    patterning the semiconductor layer into an elongated nanowire shaped channel extending substantially parallel to the major surface of the substrate;
    forming a tunneling dielectric layer over the channel;
    forming a plurality of charge storage regions over the tunneling dielectric layer;
    undercutting the channel using the plurality of charge storage regions as mask, such that the channel has a narrower width than each charge storage region width, and an overhanging portion of each of the plurality of charge storage regions overhangs the channel;
    forming a blocking dielectric layer over the plurality of charge storage regions, such that the blocking dielectric layer fills a space below the overhanging portion of each of the plurality of charge storage regions; and
    forming a plurality of control gates over the blocking dielectric layer.

2. The method of claim 1, wherein each of the plurality of charge storage regions comprises a metal floating gate or conductive nanodots isolated by the tunneling and the blocking dielectric layers, and a coupling ratio of the device is at least about 0.5.

* * * * *